(12) United States Patent
Kudoh

(10) Patent No.: US 7,696,669 B2
(45) Date of Patent: Apr. 13, 2010

(54) ELECTRICALLY CONDUCTIVE POLYMER ACTUATOR, METHOD FOR MANUFACTURING THE SAME, AND METHOD OF DRIVING THE SAME

(75) Inventor: Yuji Kudoh, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/363,284

(22) Filed: Jan. 30, 2009

(65) Prior Publication Data

US 2009/0251027 A1    Oct. 8, 2009

Related U.S. Application Data

(63) Continuation of application No. PCT/JP2008/000876, filed on Apr. 4, 2008.

(51) Int. Cl.
*H01L 41/08* (2006.01)
(52) U.S. Cl. .................. 310/311; 310/800
(58) Field of Classification Search .......... 310/800, 310/330, 328, 311; H01L 41/08, 41/09; H02N 11/00
See application file for complete search history.

(56) References Cited

U.S. PATENT DOCUMENTS

| 7,259,495 B2 * | 8/2007 | Asai et al. ............. 310/311 |
| 7,586,242 B2 * | 9/2009 | Yokoyama et al. ......... 310/800 |
| 2006/0057451 A1 | 3/2006 | Okuzaki et al. |

FOREIGN PATENT DOCUMENTS

| EP | 0 924 033 A2 | 6/1999 |
| JP | 11-169394 | 6/1999 |
| JP | 11-206162 | 7/1999 |
| JP | 2005-111245 | 4/2005 |
| JP | 2005-145987 | 6/2005 |
| JP | 2005-176428 | 6/2005 |
| JP | 2006-050780 | 2/2006 |
| JP | 2006-129541 | 5/2006 |
| JP | 2008-011593 | 1/2008 |

OTHER PUBLICATIONS

Pelrine, Ron et al., "High-Speed Electrically Actuated Elastomers with Strain Greater Than 100%," Science, vol. 287, pp. 836-839, 2000.
Ionic Liquid-Forefront of Development and Future- 2003, Hiroyuki Ohno, edit., CMC Publishing Co., Ltd.
Partial English Translation of JP 2008-011593, previously filed on Jan. 30, 2009.
Partial English Translation of JP 2005-111245, previously filed on Jan. 30, 2009.

* cited by examiner

*Primary Examiner*—Walter Benson
*Assistant Examiner*—Karen B Addison
(74) *Attorney, Agent, or Firm*—McDermott Will & Emery LLP

(57) ABSTRACT

An electrically conductive polymer actuator having a laminated structure including: a solid electrolyte membrane constituted with a mixture of an ionic liquid, and an organic polymer that contains at least one or more of a vinylidene fluoride/hexafluoropropylene copolymer [P(VDF/HFP)], polyvinylidene fluoride (PVDF), a perfluorosulfonic acid/PTFE copolymer, polymethyl methacrylate (PMMA), polyethylene oxide (PEO) and polyacrylonitrile (PAN); and an electrically conductive polymer membrane constituted with a mixture of polystyrene sulfonic acid (PSS) and polyethylenedioxythiophene (PEDOT) on at least one face of the solid electrolyte membrane, characterized in that polyethylene glycol is included in the electrically conductive polymer membrane.

6 Claims, 2 Drawing Sheets

ELECTRICALLY CONDUCTIVE POLYMER ACTUATOR, METHOD FOR MANUFACTURING THE SAME, AND METHOD OF DRIVING THE SAME

This Application is a continuation of International Application No. PCT/JP2008/000876, whose international filing date is Apr. 4, 2008 the disclosure of which Application is incorporated by reference herein.

BACKGROUND OF THE INVENTION

1. Field of the Invention

The present invention relates to an electrically conductive polymer actuator which can be applied to robots for household use and the like, a method for manufacturing the same, and a method of driving the same. In particular, the present invention relates to an actuator in which an electrochemical reaction is utilized, and a method for manufacturing the same.

2. Related Art

In recent years, necessity for actuators which are compact, light weight, and highly flexible has been increasing in the field of robots for household use and medical care, because properties similar to human muscle (for example, safety which can avoid causing injury upon contact, softness not causing pain even upon bumping) are demanded on actuators for operating robots expected to participate actively in close proximity to human bodies in supporting domestic duties and jobs at home, offices, hospitals etc., as well as in supporting for nursing of elderly persons and handicapped persons, and the like.

As compact and light weight actuators, those of electrostatic attraction type, piezoelectric type, ultrasonic type, and, shape memory alloy type and the like have been already put into practical applications. These actuators cannot be highly flexible actuators since an inorganic material is used, and due to their motion principles. Thus, attempts to provide a light weight and highly flexible actuator by using an organic material such as a polymer have been made in various fields extensively in recent years.

For example, one in which a gel is allowed to bend by an electric voltage (Japanese Unexamined Patent Application, First Publication No. Hei 11-206162/Patent Document 1), one in which a high electric voltage is applied between dielectric elastomer thin films to permit deformation (R. Pelrine, R. Kornbluh, Q. Pei and J. Joseph: Science, 287, 836-839 (2000)/Nonpatent Document 1), one in which expansion and contraction of an electrically conductive polymer is allowed by an oxidative-reductive reaction (Japanese Unexamined Patent Application, First Publication No. 2006-050780/ Patent Document 2), and the like may be exemplified.

Since the actuator of such a type in which a gel is allowed to bend by an electric voltage cannot maintain the bendability unless application of the electric voltage is kept due to small initiation stress, a problem of increase in the electric power consumption may be raised. In addition, when a dielectric elastomer thin film must be used, high voltage of several hundred to several kilo volts is required for the deformation. Thus, when such actuators are used in robots for household use, a problem of the risk such as electric shock may be raised because of excessively high voltage. To the contrary, the electrically conductive polymer actuator in which expansion and contraction of an electrically conductive polymer accompanied with an oxidative reaction is utilized has a comparatively simple structure, is easy in miniaturization and weight saving, and highly flexible. Furthermore, such an actuator can be driven at a voltage as low as several volts, and is also characterized by sufficiently high initiation stress.

A bendable actuator in which expansion and contraction of an electrically conductive polymer is utilized has a structure including an electrically conductive polymer membrane laminated on at least one face of a solid electrolyte membrane, as shown in FIG. 2. In FIG. 2, 201 designates an actuator element, 202$a$ and 202$b$ designate an electrically conductive polymer membrane, 203 designates a solid electrolyte membrane, and 204$a$ and 204$b$ designate an electrode. When the electrically conductive polymer membrane is laminated on only one face of the solid electrolyte membrane, a metal electrode thin film (counter electrode) is formed on another face of the solid electrolyte membrane for applying a voltage. In some cases, a metal electrode thin film may be formed on the electrically conductive polymer membrane for applying a voltage. Further, by applying a predetermined voltage between the electrically conductive polymer membrane and the counter electrode, or between the electrically conductive polymer membranes, bending of the laminated film is caused. The motion principle of the bending has been believed as in the following. That is, the applied voltage allows the electrically conductive polymer to be oxidatively reacted, and concomitantly, ions are incorporated into the electrically conductive polymer membrane, or taken out therefrom. The volume of the electrically conductive polymer membrane is altered in response to such in-and-out migration of the ion, and thus the actuator is bent since the solid electrolyte membrane accompanied by no change in the volume is laminated. For example, in the construction shown in FIG. 2, the actuator is bent in a downward direction when the ion is incorporated into the upside electrically conductive polymer membrane, or when the ion is taken out from the downside electrically conductive polymer membrane. To the contrary, the actuator is bent in an upward direction when the ion is taken out from the upside electrically conductive polymer membrane, or when the ion is incorporated into the downside electrically conductive polymer membrane.

Examples of the electrically conductive polymer used in an actuator include polyaniline, polypyrrole, polythiophene, and derivatives thereof (Patent Document 2).

The electrically conductive polymer actuator utilizes the in-and-out migration of the ion to and from the electrically conductive polymer membrane, which is caused concomitant with an electrical oxidation and reduction of the electrically conductive polymer, according to the motion principle. Therefore, an electrolyte is required as an ion supply source for executing motion, and a solid electrolyte having a sufficient ionic conductivity at a temperature around the room temperature is required for permitting operation in the air. In this regard, a material termed "ion gel" has been produced recently. It is a material prepared by gelatinizing at least either one of a polymer or a monomer dispersed in an ionic liquid, and allowing the ionic liquid to be retained in the three-dimensional network structure of the gel. Thus, it has flexibility, and achieves a value of $10^{-2}$ S/cm at room temperature, which is 100 times or higher than that of conventional polyether type polymer solid electrolytes (Ionic Liquid— Forefront of Development and Future—2003, Hiroyuki Ohno, edit., CMC Publishing CO., LTD./Nonpatent Document 2).

In addition, as documents which can be relevant to the present invention, Japanese Unexamined Patent Application, First Publication No. 2006-129541 (Patent Document 3) and Japanese Unexamined Patent Application, First Publication No. 2005-145987 (Patent Document 4) may be referred to.

Patent Document 3 discloses a polymer actuator device. In FIG. 9 and its description discloses a polymer actuator device which includes regulation electrode A (reference number: 203), electrolytic displacement part A formed with an electrically conductive polymer (reference number: 201), electrolyte part (reference number: 202), electrolytic displacement part B formed with an electrically conductive polymer (reference number: 201'), and regulation electrode B (reference number: 203').

Moreover, it is described that polythiophene is preferred as the electrically conductive polymer in paragraph number 0077 of Patent Document 3. The paragraph number 0078 of Patent Document 3 discloses that a fluorine based polymer such as polyvinylidene fluoride, and the copolymer thereof may be used as the polymer solid electrolyte. Furthermore, it is disclosed that sulfonic acid may be introduced into its basic skeleton.

Patent Document 4 discloses an electrically conductive polymer gel and a method for producing the same, an actuator, a patch label for introducing an ion, and a bioelectrode. In addition, Patent Document 4, paragraph number 0069 (Example 7) discloses addition of a polyethylene glycol to a poly(3,4-ethylenedioxythiophene)-poly(ethylenesulfonate) colloid dispersion liquid (abbreviated as PEDOT/PSS).

SUMMARY OF THE INVENTION

In conventional electrically conductive polymer actuators, polyaniline, polypyrrole, polythiophene and derivatives thereof have been used as electrically conductive polymers, however, just low adhesive properties are provided to each other between such an electrically conductive polymer membrane and a solid electrolyte membrane formed with an ion gel. Therefore, when an electrically conductive polymer membrane and a solid electrolyte membrane formed with an ion gel are laminated to form a bendable actuator, a problem of detachment of the electrically conductive polymer membrane from the solid electrolyte membrane formed with the ion gel has been raised in operation of the actuator.

An object of the present invention is to provide a bendable electrically conductive polymer actuator which is not accompanied by deterioration even though it is repeatedly operated, through improving adhesive properties between an electrically conductive polymer membrane and a solid electrolyte membrane formed with an ion gel to each other. Another object of the invention is to provide a method of manufacture for achieving this actuator.

The present invention provides an electrically conductive polymer actuator having a laminated structure including: a solid electrolyte membrane constituted with a mixture of an ionic liquid, and an organic polymer that contains at least one or more of a vinylidene fluoride/hexafluoropropylene copolymer [P(VDF/HFP)], polyvinylidene fluoride (PVDF), a perfluorosulfonic acid/PTFE copolymer, polymethyl methacrylate (PMMA), polyethylene oxide (PEO) and polyacrylonitrile (PAN); and an electrically conductive polymer membrane constituted with a mixture of polystyrene sulfonic acid (PSS) and polyethylenedioxythiophene (PEDOT) on at least one face of the solid electrolyte membrane, wherein polyethylene glycol is included in the electrically conductive polymer membrane.

Furthermore, the present invention provides a method for manufacturing an electrically conductive polymer actuator having a laminated structure including: a solid electrolyte membrane constituted with a mixture of an ionic liquid, and an organic polymer that contains at least one or more of a vinylidene fluoride/hexafluoropropylene copolymer [P(VDF/HFP)], polyvinylidene fluoride (PVDF), a perfluorosulfonic acid/PTFE copolymer, polymethyl methacrylate (PMMA), polyethylene oxide (PEO) and polyacrylonitrile (PAN); and an electrically conductive polymer membrane constituted with a mixture of polystyrene sulfonic acid (PSS) and polyethylenedioxythiophene (PEDOT) on at least one face of the solid electrolyte membrane, wherein the method for manufacturing an electrically conductive polymer actuator comprises the steps of: mixing polyethylene glycol in the electrically conductive polymer membrane; and laminating the electrically conductive polymer membrane on at least one face of the solid electrolyte membrane.

According to the present invention, an electrically conductive polymer actuator which effects a bending motion and is not accompanied by deterioration of the characteristics even though it is repeatedly operated, and in which adhesive properties between an electrically conductive polymer membrane and a solid electrolyte membrane formed with an ion gel can be improved.

DETAILED DESCRIPTION OF THE INVENTION

Hereinafter, the mode for carrying out the present invention is explained with reference to the drawings.

Figure 1:
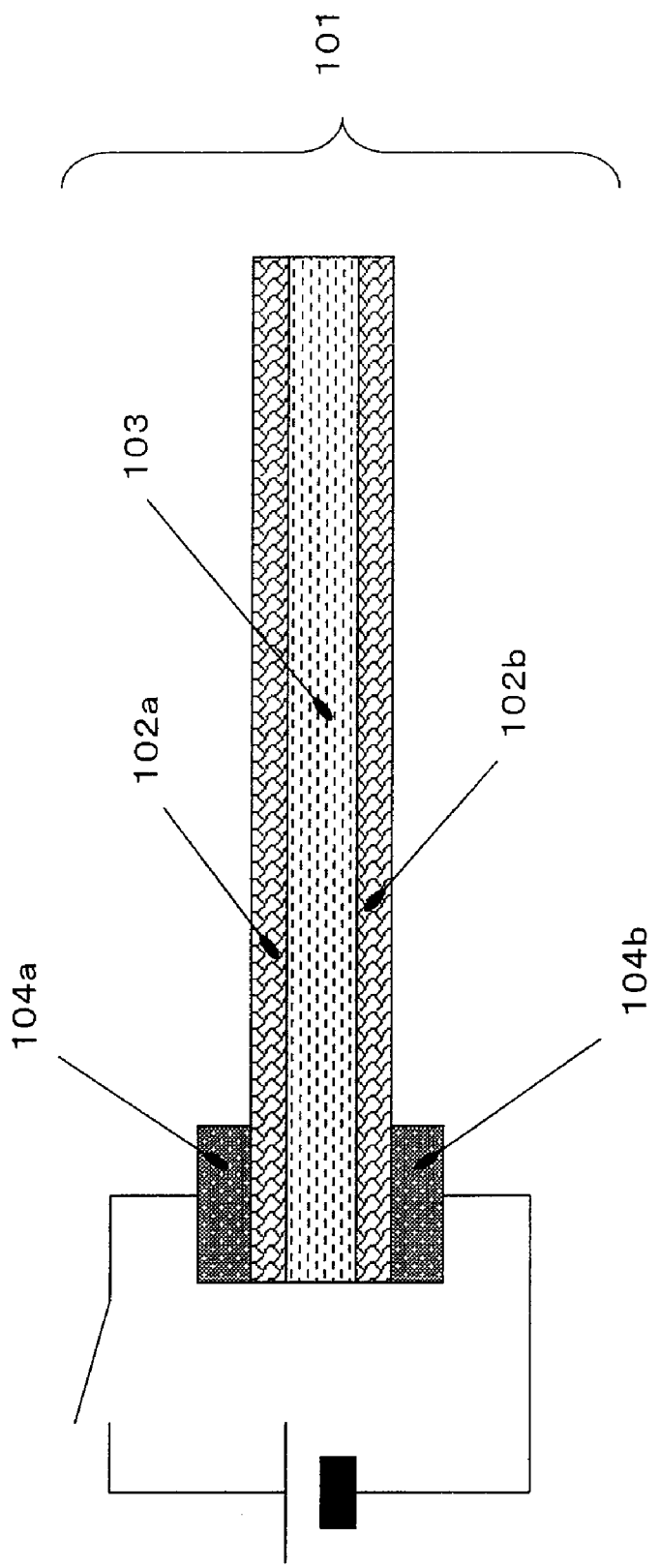
FIG. 1 shows a schematic cross-sectional view illustrating an actuator of one embodiment according to the present invention.
Figure 2:
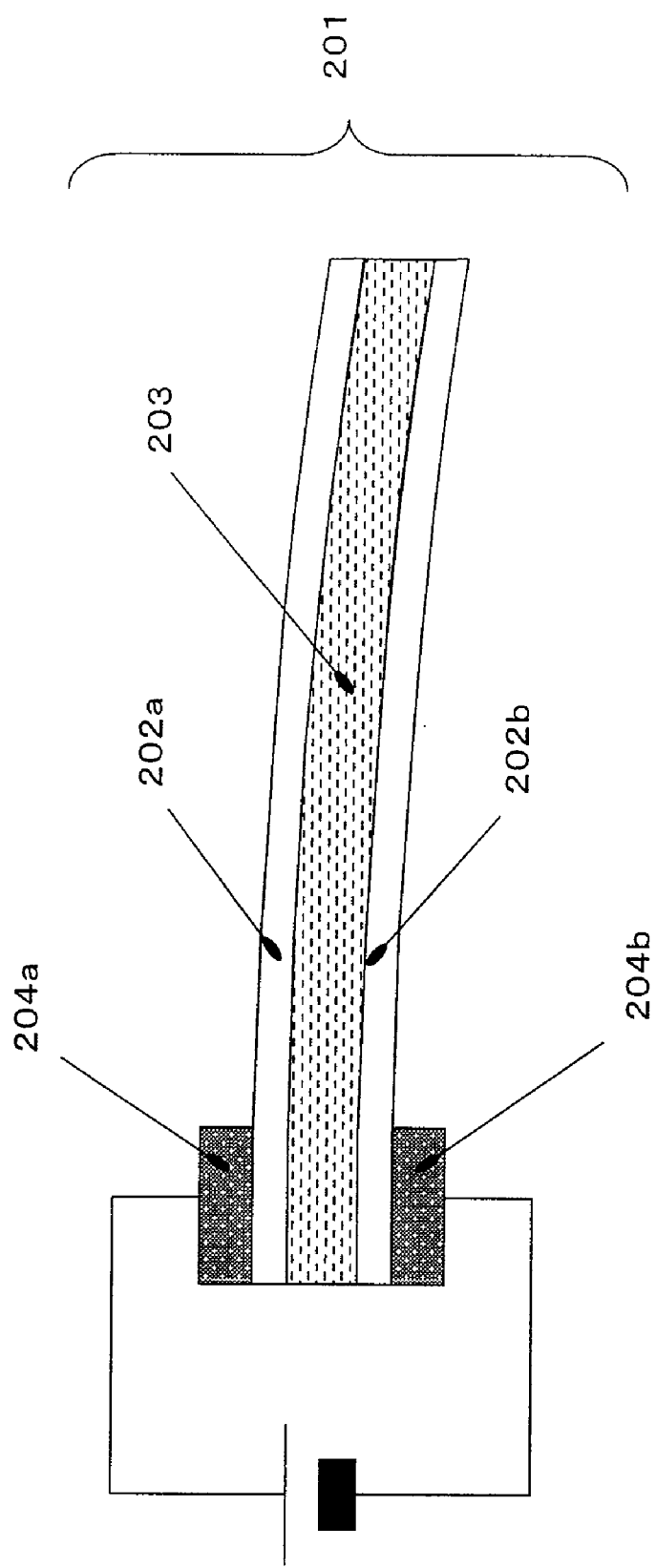
FIG. 2 shows a schematic cross-sectional view illustrating a conventional bendable actuator.

FIG. 1 shows a schematic cross-sectional view illustrating an actuator of one embodiment according to the present invention. Actuator 101 is constituted with a laminate of electrically conductive polymer membranes 102a and 102b, and solid electrolyte membrane 103, in which electrodes 104a and 104b are provided so as to sandwich one ends of the electrically conductive polymer membranes 102a and 102b, respectively. By applying a voltage of several volts between the electrode 104a and the electrode 104b, the actuator 101 effects a bending motion with the part sandwiched by the electrodes 104a and 104b which serves as a fixed part.

The electrically conductive polymer which may be used in the present invention has a conjugate double bond, whereby the p electrons are spread through the entire polymer to contribute to electronic conductivity. The electric conduction by an electrically conductive polymer has been believed to be caused via polaron and bipolaron, which are generated upon interaction of an oxidizing agent doped in the polymer and p electrons in the polymer, and serve as charging carriers. Although polyaniline, polypyrrole, polythiophene and derivatives thereof can be used as the electrically conductive polymer in the present invention, particularly, polyethylenedioxythiophene (PEDOT) is preferably included, and a mixture of polyethylenedioxythiophene (PEDOT) and polystyrene sulfonic acid (PSS) is more preferably used. In the case in which polyethylenedioxythiophene (PEDOT) is used, its monomer can be chemically polymerized beforehand, and thus an electrically conductive polymer membrane can be formed by merely coating a dispersion of this polymer on a substrate. Therefore, a polymer membrane having a uniform thickness can be readily obtained on a substrate having a great area by employing a spin coating, slit coating, bar coating, dipping or casting method. In addition, it is suited for mass production owing to simple process for production.

The polyethylenedioxythiophene (PEDOT) and polystyrene sulfonic acid (PSS) in the mixture that constitutes the electrically conductive polymer are represented by [chemical formula 1] and [chemical formula 2], respectively. Polyethylenedioxythiophene is characteristic in that it is less likely to be subjected to oxidative deterioration since the β-position of its chemically active five-membered ring is previously inactivated by modification with oxygen. Additionally, polystyrene sulfonic acid is strongly bound to polyethylenedioxythiophene via ionic bonds in the mixture.

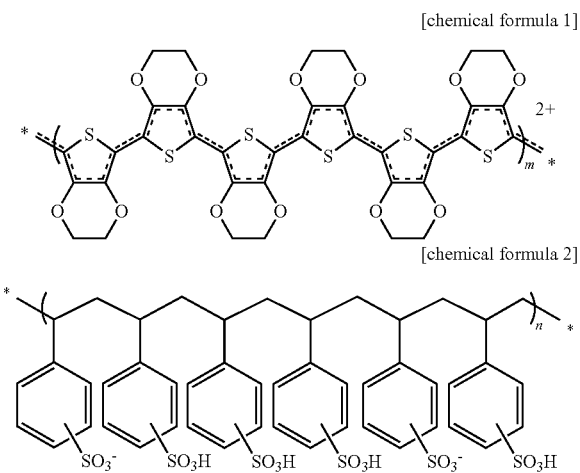

[chemical formula 1]

[chemical formula 2]

The present inventors found that to admix with the electrically conductive polymer an organic molecule that is different from the molecule of the electrically conductive polymer is effective in order to improve the adhesive properties between the electrically conductive polymer membrane and the solid electrolyte membrane. In particular, the present inventors found that the adhesive properties are prominently improved by using polyethylene glycol as the organic molecule. The electrically conductive polymer membrane in which polyethylene glycol is admixed can be produced by preparing a liquid in which polyethylene glycol is dissolved in an electrically conductive polymer dispersion liquid or solution, coating this liquid on a substrate, and thereafter drying the solvent. The mixing percentage of polyethylene glycol with respect to the electrically conductive polymer dispersion liquid or solution (content of the electrically conductive polymer solid: 1% by weight) is preferably from 0.05% by weight to 10% by weight, and more preferably from 0.1% by weight to 5% by weight. When the amount is below this range, the improvement of the adhesive properties between the electrically conductive polymer membrane and the solid electrolyte membrane formed with an ion gel cannot be achieved, and the electrically conductive polymer membrane is detached from the solid electrolyte membrane in operating the produced actuator, whereby the bending motion may be difficult. To the contrary, when the amount is above this range, to obtain the membrane form of the electrically conductive polymer may be difficult.

Details of the mechanism which determine the adhesive force between the electrically conductive polymer membrane and the solid electrolyte membrane formed with an ion gel have not been well elucidated, however, the present inventors found from a large number of experiments, although phenomenologically, that the adhesive properties greatly vary depending on the difference in wettability of the electrically conductive polymer membrane surface with respect to water.

In addition, it was revealed that this wettability was altered by mixing with the electrically conductive polymer an organic molecule which is different from the molecule of the polymer. For example, in the case of the electrically conductive polymer membrane constituted with a mixture of PEDOT and PSS alone, or in the case in which polyvinyl alcohol was mixed therewith, the electrically conductive polymer membrane did not attach to the solid electrolyte membrane formed with an ion gel in thus produced actuator, whereby the bending motion could be difficult. In this instance, the static contact angle of the electrically conductive polymer membrane surface with respect to pure water was no less than 41.1°. To the contrary, in the actuator produced through admixing polyethylene glycol with the electrically conductive polymer constituted with a mixture of PEDOT and PSS strongly, adhesion to the solid electrolyte membrane formed with an ion gel was exhibited, and successful bending motion could be achieved. In this instance, the static contact angle of the polymer membrane surface with respect to water was no greater than 35.5°. It is speculated from these results that the density of the polar group on the electrically conductive polymer membrane surface exceeds a certain level when the contact angle is smaller than a certain value, and this density of the polar group may participate in binding with the molecules that constitute the solid electrolyte.

The solid electrolyte membrane 103 used in the present invention is a material termed "ion gel", which is prepared by gelatinizing at least either one of a polymer or a monomer dispersed in an ionic liquid, and allowing the ionic liquid to be retained in the three-dimensional network structure of the gel. Thus, it has flexibility, and achieves a value of $10^{-2}$ S/cm at room temperature, which is 100 times or higher than that of conventional polyether type polymer solid electrolytes. As the solid electrolyte membrane, the ion gel can be used alone, but the ion gel can be also used after impregnating in a porous membrane such as paper, membrane filter or the like.

The ionic liquid is also referred to as "ordinary temperature molten salt" or merely as "molten salt", which is a salt that exhibits a molten state in a wide temperature range including ordinary temperatures (room temperatures).

In the present invention, well known various types of ionic liquids can be used, but those which exhibit a liquid state at ordinary temperatures (room temperatures) or at temperatures approximate to ordinary temperatures (room temperatures), and which are stable are preferred.

As the ionic liquid preferably used in the present invention, illustrative examples include those containing a cation represented by the following [chemical formula 3] to [chemical formula 6], and an anion ($X^-$).

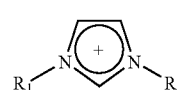

[chemical formula 3]

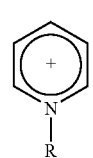

[chemical formula 4]

[chemical formula 5]

[chemical formula 6]

In the above [chemical formula 3] to [chemical formula 6], R represents an alkyl group having 1 to 12 carbon atoms, or an alkyl group having an ether linkage and having 3 to 12 carbon and oxygen atoms in total number. In the [chemical formula 3], $R_1$ represents an alkyl group having 1 to 4 carbon atoms or a hydrogen atom. In the [chemical formula 3], R is preferably different from $R_1$. In the [chemical formula 5] and [chemical formula 6], x each represents an integer of from 1 to 4. In the present invention, an imidazolium ion represented by the [chemical formula 3] is more preferred.

As the anion ($X^-$), at least one selected from tetrafluoroboric acid anion, hexafluorophosphoric acid anion, bis(trifluoromethanesulfonyl)imidic acid anion, perchloric acid anion, tris(trifluoromethanesulfonyl)carbon acid anion, trifluoromethanesulfonic acid anion, dicyanamide anion, trifluoroacetic acid anion, organic carboxylic acid anion and halogen ion is preferred.

Examples of the organic polymer which can be used in obtaining a gelatinous composition to be employed as the ion gel include vinylidene fluoride/hexafluoropropylene copolymers [P(VDF/HFP)], polyvinylidene fluoride (PVDF), perfluorosulfonic acid/PTFE copolymers, polymethyl methacrylate (PMMA), polyethylene oxide (PEO), and polyacrylonitrile (PAN).

Alternatively, a gelatinous composition to be employed as the ion gel can be obtained also by dissolving a monomer (for example, methyl methacrylate, MMA), a crosslinking agent (for example, ethylene glycol dimethacrylate, EGDMA), and a polymerization initiator (for example, azobisisobutyronitrile, AIBN) in an ionic liquid, and permitting the polymerization reaction in the ionic liquid to form an organic polymer.

The solid electrolyte can be obtained by preparing an ion gel precursor by mixing the ionic liquid and at least one of the polymer or monomer described above, and heating the mixture followed by cooling. In light of the strength and ionic conductivity, the weight ratio in the case of the mixture including the ionic liquid and the organic polymer is preferably 9:1 to 6:4, and more preferably 8:2 to 7:3. Also, the molar ratio in the case of the mixture including the ionic liquid and the monomer is preferably 3:7 to 7:3, and more preferably 4:6 to 6:4.

The electrode is acceptable as long as it has electronic conductivity, and can readily accept and donate the electron from and to the electrically conductive polymer without causing a chemical reaction with the electrically conductive polymer. Examples of the electrode which can be used include metals such as gold, silver, platinum, copper and chromium, and carbon-containing plates.

Hereinafter, the actuator according to the present invention is explained in more detail by way of Examples, however, the present invention is not limited thereto.

EXAMPLE 1

Production of Electrically Conductive Polymer Membrane in which Organic Molecules are Admixed On a slide glass subjected to a treatment with oxygen plasma after washing with acetone was added dropwise a predetermined amount of an aqueous dispersion liquid (manufactured by H. C. Starck GmbH, trade name: Baytron (R) PH500) of a mixture of PSS and PEDOT in which 5% by weight of dimethyl sulfoxide (DMSO) and 1% by weight of polyethylene glycol 8000 were dissolved. Thereafter, the solvent was volatilized by air drying at a room temperature, whereby an electrically conductive polymer membrane was formed on the slide glass. Finally, the electrically conductive polymer membrane was detached from the slide glass using a razor. Thus obtained electrically conductive polymer membrane had a mean thickness of 10 µm, an electric conductivity of 300 S/cm as determined with a four-probe method, and a static contact angle with respect to pure water of 23.0°.

Preparation of Material of Ion Gel

In the ionic liquid for producing the ion gel, ethylmethyl imidazolium (EMI) was used as a cation, while bis(trifluoromethanesulfonyl)imide [$(CF_3SO_2)_2N^-$] (TFSI) was used as an anion. As the polymer to be mixed, a vinylidene fluoride/hexafluoropropylene copolymer [P(VDF/HFP)] was used. The mixing ratio of EMITFSI to P(VDF/HFP) was 8:2 by weight ratio, and after mixing, the liquid was sufficiently stirred using a magnetic stirrer. Hereinafter, this mixed liquid is designated as ion gel precursor.

Production of Electrolyte Ion Gel

A polyethylene terephthalate (PET) sheet having a thickness of 0.1 mm was cut into a size of 76 mm×26 mm, and this piece was brought into close contact with a slide glass having a size of 76 mm×26 mm. Two sets of such a combination were produced. Thereafter, the produced slide glasses were brought into close contact such that two PET sheets were opposed spacing with a predetermined interval, with a capacitor separator paper having a thickness of 40 µm interposed therebetween. In this process, the ion gel precursor was impregnated into the capacitor separator paper. Then, an ion gel-impregnated paper having a thickness of 40 µm was obtained by heating in a thermoregulated bath at 100° C. for 30 min, and thereafter cooling to a room temperature. Since the adhesive property between the PET sheet and the ion gel-impregnated paper to each other is very poor, they could be readily detached. Hereinafter, the ion gel-impregnated paper hereby obtained is referred to as "electrolyte ion gel".

Lamination of Electrolyte Ion Gel-Electrically Conductive Polymer Membrane

A three-layer structure of "electrically conductive polymer membrane/electrolyte ion gel/electrically conductive polymer membrane" was formed by overlaying the electrically conductive polymer membrane on both faces of the electrolyte ion gel so as to allow the faces were opposed, heating in a thermoregulated bath at 100° C. for 30 min, and thereafter cooling to a room temperature. This three-layer structure was cut to provide a width of 2.5 mm and a length of 15 mm. A platinum electrode having a width of 2 mm and a length of 10 mm was mounted on thus obtained structure at a region 5 mm away in the longitudinal direction from one end. Thus, a bendable electrically conductive polymer actuator having a length of the movable portion being 10 mm was produced.

The bending displacement magnitude was evaluated by triangulation measurement using a laser displacement meter. The measurement point of the triangulation measurement was positioned 5 mm away in the lengthwise direction from the point where the electrode was mounted.

When a voltage of ±1.0 V was applied to this actuator, the bending motion was effected in response to the applied voltage without causing detachment at the electrolyte ion gel-electrically conductive polymer membrane boundary surface. The displacement magnitude observed upon driving with a rectangular pulse of 1 Hz is shown in Table 1.

TABLE 1

|  | Number of driving times (time) | | | | | |
| --- | --- | --- | --- | --- | --- | --- |
|  | 1 | 60 | 120 | 600 | 1800 | 5400 |
| Example 1 Displacement magnitude (mm) | 0.54 | 0.53 | 0.50 | 0.46 | 0.45 | 0.42 |

From Table 1, it is suggested that the bendable electrically conductive polymer actuator having this constitution is superior in adhesive properties of the electrically conductive polymer membrane and the solid electrolyte membrane, and can be operated for a long period of time.

EXAMPLE 2

Production of Electrically Conductive Polymer Membrane in which Organic Molecules are Admixed On a silicon substrate subjected to a treatment with oxygen plasma after washing with acetone was added dropwise a predetermined amount of an aqueous dispersion liquid (manufactured by H. C. Starck GmbH, trade name: Baytron (R) PH500) of a mixture of PSS and PEDOT in which 5% by weight of N-methylpyrrolidone (NMP) and 5% by weight of polyethylene glycol 8000 were dissolved. Thereafter, the solvent was volatilized by air drying at a room temperature, whereby an electrically conductive polymer membrane was formed on the silicon substrate. Finally, the silicon substrate was immersed in 50% by volume of an aqueous potassium hydroxide solution to detach the electrically conductive polymer membrane from the substrate. Thus obtained electrically conductive polymer membrane had a mean thickness of 8 μm, an electric conductivity of 280 S/cm as determined with a four-probe method, and a static contact angle with respect to pure water of 25.1°.

Preparation of Material of Ion Gel

In the ionic liquid for producing the ion gel, butylmethyl imidazolium (BMI) was used as a cation, while hexafluorophosphoric acid anion ($PF_6^-$) was used as an anion. As the polymer to be mixed, a vinylidene fluoride/hexafluoropropylene copolymer [P(VDF/HFP)] was used. The mixing ratio of EMITFSI to P(VDF/HFP) was 8:2 by weight ratio, and after mixing, the liquid was sufficiently stirred using a magnetic stirrer. Hereinafter, this mixed liquid is designated as ion gel precursor.

Production of Electrolyte Ion Gel

A polyethylene terephthalate (PET) sheet having a thickness of 0.1 mm was cut into a size of 76 mm×26 mm, and this piece was brought into close contact with a slide glass having a size of 76 mm×26 mm. Two sets of such a combination were produced. Thereafter, the produced slide glasses were brought into close contact such that two PET sheets were opposed spacing with a predetermined interval, with a capacitor separator paper having a thickness of 40 μm interposed therebetween. In this process, the ion gel precursor was impregnated into the capacitor separator paper. Then, an ion gel-impregnated paper having a thickness of 40 μm was obtained by heating in a thermoregulated bath at 100° C. for 30 min, and thereafter cooling to a room temperature. Since the adhesive property between the PET sheet and the ion gel-impregnated paper to each other is very poor, they could be readily detached. Hereinafter, the ion gel-impregnated paper hereby obtained is referred to as "electrolyte ion gel".

Lamination of Electrolyte Ion Gel-Electrically Conductive Polymer Membrane

A three-layer structure of "electrically conductive polymer membrane/electrolyte ion gel/electrically conductive polymer membrane" was formed by overlaying the electrically conductive polymer membrane on both faces of the electrolyte ion gel so as to allow the faces were opposed, heating in a thermoregulated bath at 100° C. for 30 min, and thereafter cooling to a room temperature. This three-layer structure was cut to provide a width of 2.5 mm and a length of 15 mm. A platinum electrode having a width of 2 mm and a length of 10 mm was mounted on thus obtained structure at a region 5 mm away in the longitudinal direction from one end. Thus, a bendable electrically conductive polymer actuator having a length of the movable portion being 10 mm was produced.

When a voltage of ±1.0 V was applied to this actuator, the bending motion was effected in response to the applied voltage without causing detachment at the electrolyte ion gel-electrically conductive polymer membrane boundary surface. The displacement magnitude observed upon driving with a rectangular pulse of 1 Hz is shown in Table 2.

TABLE 2

| | Number of driving times (time) | | | | | |
|---|---|---|---|---|---|---|
| | 1 | 60 | 120 | 600 | 1800 | 5400 |
| Example 2 Displacement magnitude (mm) | 0.52 | 0.51 | 0.47 | 0.44 | 0.42 | 0.40 |

From Table 2, it is suggested that the bendable electrically conductive polymer actuator having this constitution is superior in adhesive properties of the electrically conductive polymer membrane and the solid electrolyte membrane, and can be operated for a long period of time.

EXAMPLE 3

A bendable electrically conductive polymer actuator was produced in a similar manner to Example 1 except that polyethylene glycol 8000 was dissolved in an amount of 0.05, 0.1, 0.5, 5, or 10% by weight. When a voltage of ±1.0 V was applied to these actuators, the bending motion was effected in response to the applied voltage without causing detachment at the electrolyte ion gel-electrically conductive polymer membrane boundary surface, and in regard to the displacement magnitude with a rectangular pulse of 1 Hz, the mean displacement magnitude of initial ten times measurements was revealed to be no less than 0.50 mm. Thus, these actuators can provide stable bending motion even though they were continuously driven for a long period of time, similarly to Examples 1 and 2. To the contrary, when the dispersion liquid in which polyethylene glycol 8000 had been dissolved in an amount of 20% by weight was used, the membrane was so fragile that a bendable electrically conductive polymer actuator could not be produced when a similar manner to that in Example 1 was employed. (Table 3)

TABLE 3

| | Amount of mixed polyethylene glycol (percent by weight) | | | |
|---|---|---|---|---|
| | 0 | 0.05 | 0.1 | 0.5 |
| Electrically conductive polymer actuator Production and Bending motion | Bending motion failed | no less than 0.50 mm Bending motion effected | no less than 0.50 mm Bending motion effected | no less than 0.50 mm Bending motion effected |
| | Amount of mixed polyethylene glycol (percent by weight) | | | |
| | 1 | 5 | 10 | 20 |
| Electrically conductive polymer actuator Production and Bending motion | no less than 0.50 mm Bending motion effected | no less than 0.50 mm Bending motion effected | no less than 0.50 mm Bending motion effected | Actuator not produced |

COMPARATIVE EXAMPLE 1

On a slide glass subjected to a treatment with oxygen plasma after washing with acetone was added dropwise a predetermined amount of an aqueous dispersion liquid (manufactured by H. C. Starck GmbH, trade name. Baytron (R)PH-500) of a mixture of PSS and PEDOT in which 5% by weight of dimethyl sulfoxide (DMSO) was dissolved.

Thereafter, the solvent was volatilized by air drying at a room temperature, whereby an electrically conductive polymer membrane was formed on the slide glass. Finally, the electrically conductive polymer membrane was detached from the slide glass using a razor. Thus resulting membrane had a static contact angle with respect to pure water of 45.5°.

A three-layer structure of was formed by overlaying the electrically conductive polymer membrane on both faces of the electrolyte ion gel produced in a similar manner to Example 1, heating in a thermoregulated bath at 100° C. for 30 min, and thereafter cooling to a room temperature, thereby adhering the electrically conductive polymer membrane with the electrolyte ion gel. This three-layer structure was cut to provide a width of 2.5 mm and a length of 15 mm. A platinum electrode having a width of 2 mm and a length of 10 mm was mounted on thus obtained structure at a region 5 mm away in the longitudinal direction from one end. Thus, a bendable electrically conductive polymer actuator having a length of the movable portion being 10 mm was produced.

This actuator exhibited very poor adhesive properties between the electrolyte ion gel and the electrically conductive polymer membrane. Further, when a voltage of ±1.0 V was applied, detachment was caused at the electrolyte ion gel-electrically conductive polymer membrane boundary surface without effecting any bending motion in response to the applied voltage, and in regard to the displacement magnitude with a rectangular pulse of 1 Hz, the mean displacement magnitude of initial ten times measurements was revealed to be no less than 0.05 mm. (Table 3)

COMPARATIVE EXAMPLE 2

On a silicon substrate subjected to a treatment with oxygen plasma after washing with acetone was added dropwise a predetermined amount of an aqueous dispersion liquid (manufactured by H. C. Starck GmbH, trade name: Baytron® PH500) of a mixture of PSS and PEDOT in which 5% by weight of N-methylpyrrolidone (NMP) was dissolved. Thereafter, the solvent was volatilized by air drying at a room temperature, whereby an electrically conductive polymer membrane was formed on the silicon substrate. Finally, the silicon substrate was immersed in 50% by volume of an aqueous potassium hydroxide solution to detach the electrically conductive polymer membrane from the substrate. Thus resulting electrically conductive polymer membrane had a static contact angle with respect to pure water of 41.1°.

A three-layer structure of was formed by overlaying the electrically conductive polymer membrane on both faces of the electrolyte ion gel produced in a similar manner to Example 2, heating in a thermoregulated bath at 100° C. for 30 min, and thereafter cooling to a room temperature, thereby adhering the electrically conductive polymer membrane and the electrolyte ion gel and. This three-layer structure was cut to provide a width of 2.5 mm and a length of 15 mm. A platinum electrode having a width of 2 mm and a length of 10 mm was mounted on thus obtained structure at a region 5 mm away in the longitudinal direction from one end. Thus, a bendable electrically conductive polymer actuator having a length of the movable portion being 10 mm was produced.

This actuator exhibited very poor adhesive properties between the electrolyte ion gel and the electrically conductive polymer membrane. Further, when a voltage of ±1.0 V was applied, detachment was caused at the electrolyte ion gel-electrically conductive polymer membrane boundary surface without effecting any bending motion in response to the applied voltage, and in regard to the displacement magnitude with a rectangular pulse of 1 Hz, the mean displacement magnitude of initial ten times measurements was revealed to be no less than 0.05 mm. (Table 3)

COMPARATIVE EXAMPLE 3

On a slide glass subjected to a treatment with oxygen plasma after washing with acetone was added dropwise a predetermined amount of an aqueous dispersion liquid (manufactured by H. C. Starck GmbH, trade name: Baytron (R) PH500) of a mixture of PSS and PEDOT in which 5% by weight of dimethyl sulfoxide (DMSO) and 1% by weight of polyvinyl alcohol 22000 were dissolved.

Thereafter, the solvent was volatilized by air drying at a room temperature, whereby an electrically conductive polymer membrane was formed on the slide glass. Finally, the electrically conductive polymer membrane was detached from the slide glass using a razor. Thus resulting membrane had a static contact angle with respect to pure water of 60.4°.

A three-layer structure of was formed by overlaying the electrically conductive polymer membrane on both faces of the electrolyte ion gel produced in a similar manner to Example 1, heating in a thermoregulated bath at 100° C. for 30 min, and thereafter cooling to a room temperature, thereby adhering the electrically conductive polymer membrane with the electrolyte ion gel. This three-layer structure was cut to provide a width of 2.5 mm and a length of 15 mm. A platinum electrode having a width of 2 mm and a length of 10 mm was mounted on thus obtained structure at a region 5 mm away in the longitudinal direction from one end. Thus, a bendable electrically conductive polymer actuator having a length of the movable portion being 10 mm was produced.

This actuator exhibited very poor adhesive properties between the electrolyte ion gel and the electrically conductive polymer membrane. Further, when a voltage of ±1.0 V was applied, detachment was caused at the electrolyte ion gel-electrically conductive polymer membrane boundary surface without effecting any bending motion in response to the applied voltage, and in regard to the displacement magnitude with a rectangular pulse of 1 Hz, the mean displacement magnitude of initial ten times measurements was revealed to be no less than 0.05 mm.

According to the present invention, manufacture of compact and light weight, and highly flexible actuators in a simple manner is enabled, and they can be suitably used in the field of robots for medical care, industry, and household use, as well as micromachines, and the like.

What is claimed is:

1. A bendable electrically conductive polymer actuator composed of a laminate wherein a first electrode, a solid electrolyte membrane, an electrically conductive polymer membrane, and a second electrode are laminated in this order, wherein:

the solid electrolyte membrane is constituted with a mixture of an organic polymer and an ionic liquid;

the organic polymer comprises at least one or more of a vinylidene fluoride/hexafluoropropylene copolymer [P(VDF/HFP)], polyvinylidene fluoride (PVDF), a perfluorosulfonic acid/PTFE copolymer, polymethyl methacrylate (PMMA), polyethylene oxide (PEO) and polyacrylonitrile (PAN); and the electrically conductive polymer membrane is constituted with a mixture of polyethylenedioxythiophene (PEDOT) and polystyrene sulfonic acid (PSS), and wherein the electrically conductive polymer contains polyethylene.

2. The bendable electrically conductive polymer actuator according to claim 1, wherein a second electrically conductive polymer membrane is provided between the first electrode and the solid electrolyte membrane;

the second electrically conductive polymer membrane is constituted with a mixture of polyethylenedioxythiophene (PEDOT) and polystyrene sulfonic acid (PSS); and the electrically conductive polymer contains polyethylene.

3. The bendable electrically conductive polymer actuator according to claim 1, wherein the organic polymer is the vinylidene fluoride/hexafluoropropylene copolymer [P(VDF/HFP)].

4. A method of driving a bendable electrically conductive polymer actuator composed of a laminate wherein a first electrode, a solid electrolyte membrane, an electrically conductive polymer membrane, and a second electrode are laminated in this order, wherein:

the solid electrolyte membrane is constituted with a mixture of an organic polymer and an ionic liquid;

the organic polymer comprises at least one or more of a vinylidene fluoride/hexafluoropropylene copolymer [P(VDF/HFP)], polyvinylidene fluoride (PVDF), a perfluorosulfonic acid/PTFE copolymer, polymethyl methacrylate (PMMA), polyethylene oxide (PEO) and polyacrylonitrile (PAN);

the electrically conductive polymer membrane is constituted with a mixture of polyethylenedioxythiophene (PEDOT) and polystyrene sulfonic acid (PSS); and the electrically conductive polymer contains polyethylene, the method comprising the step of applying an electric potential difference between the first electrode and the second electrode.

5. The method of driving a bendable electrically conductive polymer actuator according to claim 4, wherein a second electrically conductive polymer membrane is provided between the first electrode and the solid electrolyte membrane;

the second electrically conductive polymer membrane is constituted with a mixture of polyethylenedioxythiophene (PEDOT) and polystyrene sulfonic acid (PSS); and the electrically conductive polymer contains polyethylene.

6. The method of driving a bendable electrically conductive polymer actuator according to claim 4, wherein the organic polymer is the vinylidene fluoride/hexafluoropropylene copolymer [P(VDF/HFP)].

* * * * *